United States Patent
Wang

(10) Patent No.: US 7,807,992 B2
(45) Date of Patent: Oct. 5, 2010

(54) ORGANIC ELECTRONIC DEVICE HAVING DUAL EMITTER DOPANTS

(75) Inventor: Ying Wang, Wilmington, DE (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 693 days.

(21) Appl. No.: 11/644,491

(22) Filed: Dec. 22, 2006

(65) Prior Publication Data

US 2007/0145360 A1 Jun. 28, 2007

Related U.S. Application Data

(60) Provisional application No. 60/754,435, filed on Dec. 28, 2005.

(51) Int. Cl.
*H01L 35/24* (2006.01)
*H01L 51/00* (2006.01)

(52) U.S. Cl. ....................................................... 257/40
(58) Field of Classification Search .................... 257/40
See application file for complete search history.

(56) References Cited

U.S. PATENT DOCUMENTS

| | | | |
|---|---|---|---|
| 5,247,190 A | 9/1993 | Friend et al. | |
| 5,408,109 A | 4/1995 | Heeger et al. | |
| 5,552,678 A | 9/1996 | Tang | |
| 6,303,238 B1 | 10/2001 | Thompson et al. | |
| 6,670,645 B2 * | 12/2003 | Grushin et al. | 257/98 |
| 2001/0019782 A1 | 9/2001 | Igarashi et al. | |
| 2004/0029133 A1 | 2/2004 | Herrnstadt | |
| 2004/0254297 A1 | 12/2004 | Hsu et al. | |

FOREIGN PATENT DOCUMENTS

| | | |
|---|---|---|
| EP | 443861 B1 | 7/1995 |
| EP | 1191612 A2 | 3/2002 |
| EP | 1191614 A2 | 3/2002 |
| WO | 0070655 A1 | 11/2000 |
| WO | 0141512 A1 | 6/2001 |
| WO | 0202714 A2 | 1/2002 |
| WO | 0215645 A1 | 2/2002 |

OTHER PUBLICATIONS

CRC Handbook of Chemistry and Physics, 81st Ed., 2000-2001 (Book Not Supplied).
D. F. O'Brien et al., Electrophosphorescence From a Doped Polymer Light Emitting Diode, Synth. Metals, vol. 116:379-383, 2001.
I. H. Champbell et al., Excitation Transfer Processes in a Phosphor-Doped Poly(P-Phenylene Vinylene) Light-Emitting Diode, Physical Review B, vol. 65:085210-1-085210-8, 2002.

* cited by examiner

*Primary Examiner*—Eugene Lee
*Assistant Examiner*—Anthony Ho
(74) *Attorney, Agent, or Firm*—John H. Lamming

(57) ABSTRACT

Electronic devices comprising an anode, buffer layer, hole transport layer, photoactive layer, electron transport layer, electron injection layer, and cathode are provided, where the photoactive layer comprises a dual dopant in a metallic complex. The dopants are selected so that their emitting wavelengths are essentially the same, while their ionization potentials and electron affinities are substantially different. The dual dopant device allows for tuning the ionization potential of one dopant to enhance hole injection and/or minimize hole trapping, while independently tuning the electron affinity of the other dopant to enhance electron injection and/or minimize electron trapping.

18 Claims, 4 Drawing Sheets

Emitter:host

Emitter:host

Emitter:host

Emitter:host

Figure 3. Efficiency (cd/A) versus voltage curves for three different emitters: red1, red 2, and red 1+red2 mixtures
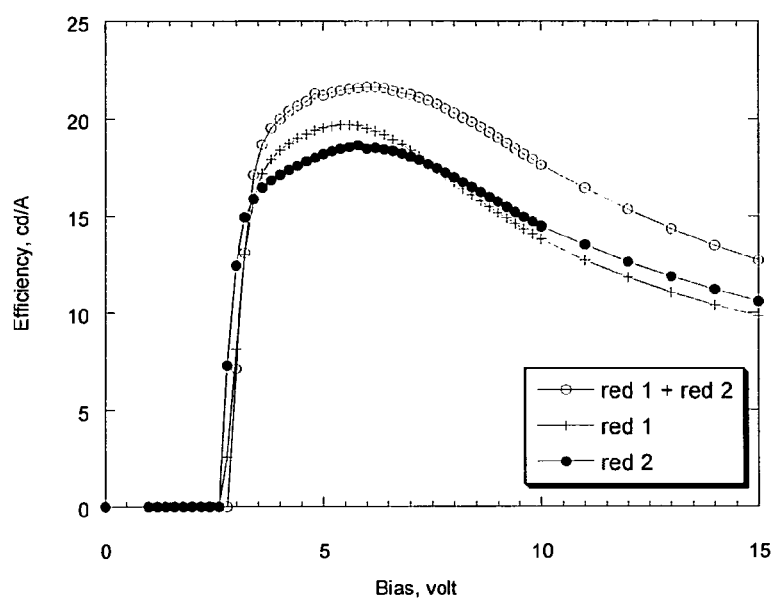

Figure 4. Electroluminescent spectra of three different emitters: red1, red 2, and red 1+red2 mixtures
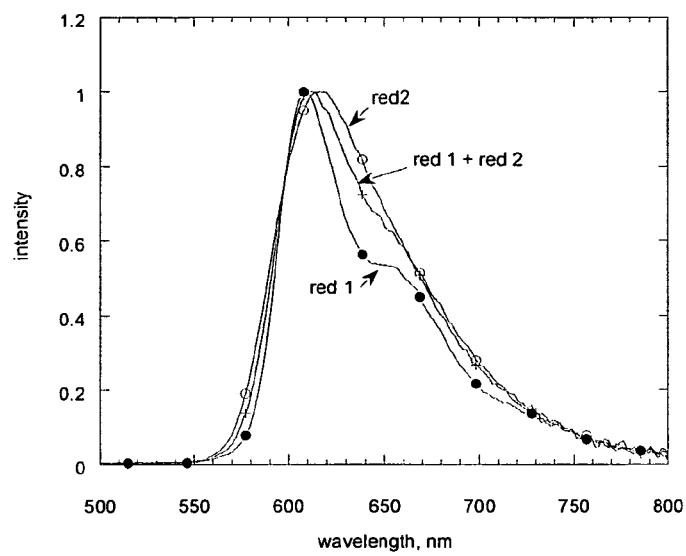

ORGANIC ELECTRONIC DEVICE HAVING DUAL EMITTER DOPANTS

CROSS REFERENCE TO RELATED APPLICATION

This application claims priority under 35 U.S.C. §119(e) from U.S. Provisional Application Ser. No. 60/754,435, filed Dec. 28, 2005, which is incorporated by reference as if fully set forth herein.

BACKGROUND INFORMATION

1. Field of the Disclosure

This disclosure relates in general to electronic devices having a photoactive layer.

2. Description of the Related Art

Organic electronic devices that emit light, such as light-emitting diodes that make up displays, are present in many different kinds of electronic equipment. In all such devices, an organic active layer is sandwiched between two electrical contact layers. At least one of the electrical contact layers is light-transmitting so that light can pass through the electrical contact layer. The organic active layer emits light through the light-transmitting electrical contact layer upon application of electricity across the electrical contact layers.

It is well known to use organic electroluminescent compounds as the active component in light-emitting diodes. Simple organic molecules such as anthracene, thiadiazole derivatives, and coumarin derivatives are known to show electroluminescence. Semiconductive conjugated polymers have also been used as electroluminescent components, as has been disclosed in, for example, Friend et al., U.S. Pat. No. 5,247,190, Heeger et al., U.S. Pat. No. 5,408,109, and Nakano et al., Published European Patent Application 443 861. Complexes of 8-hydroxyquinolate with trivalent metal ions, particularly aluminum, have been extensively used as electroluminescent components, as has been disclosed in, for example, Tang et al., U.S. Pat. No. 5,552,678.

However, there is a continuing need for electroluminescent materials.

SUMMARY

There is provided an electronic device comprising:
a hole transport layer having an ionization potential $IP_{HT}$, and an electron affinity $EA_{HT}$,
a photoactive layer, and
an electron transport layer having an ionization potential $IP_{ET}$, and an electron affinity $EA_{ET}$,
wherein the photoactive layer comprises:
a host having an ionization potential $IP_H$ and an electron affinity $EA_H$,
a first photoactive material having a peak wavelength $\lambda 1$, an emission color with coordinates x1 and y1, an ionization potential $IP_{P1}$ and an electron affinity $EA_{P1}$, and
a second photoactive material, having a peak wavelength $\lambda 2$, an emission color with coordinates x2 and y2, an ionization potential $IP_{P2}$ and an electron affinity $EA_{P2}$;
wherein:
when $\lambda 1$ is 570 to 650 nm:
$\lambda 1$-$\lambda 2$ is less than 20 nm, absolute value,
x1 and x2 are 0.6-0.7, and
y1 and y2 are 0.28-0.38;
when $\lambda 1$ is 500 to 569 nm:
$\lambda 1$-$\lambda 2$ is less than 15 nm, absolute value,
x1 and x2 are 0.2-0.35, and
y1 and y2 are 0.58-0.75;
when $\lambda 1$ is 440 to 499 nm:
$\lambda 1$-$\lambda 2$ is less than 10 nm, absolute value,
x1 and x2 are 0.1-0.2, and
y1 and y2 are 0.05-0.25,
and further wherein
$IP_{P1}$-$IP_{P2}$>0.1 eV, absolute value,
$EA_{P1}$-$EA_{P2}$>0.1 eV, absolute value.

There is also provided a device as described above, further wherein at least one of the following relationships is met:
(a) ($IP_{P1}$ or $IP_{P2}$)-$IP_{HT}$<0.5 eV, absolute value
(b) ($EA_{P1}$ or $EA_{P2}$)-$EA_{HT}$<0.5 eV, absolute value
(c) ($IP_{P1}$ or $IP_{P2}$)-$IP_H$<0.5 eV, absolute value
(d) ($EA_{P1}$ or $EA_{P2}$)-$EA_{HT}$<0.5 eV, absolute value The foregoing general description and the following detailed description are exemplary and explanatory only and are not restrictive of the invention, as defined in the appended claims.

BRIEF DESCRIPTION OF THE FIGURES

Embodiments are illustrated in the accompanying figures to improve understanding of concepts as presented herein.

FIG. 3 includes a graph showing efficiency vs. voltage for different devices.

FIG. 4 includes a graph of the electroluminescent spectra for different emitters.

Figure 1A:
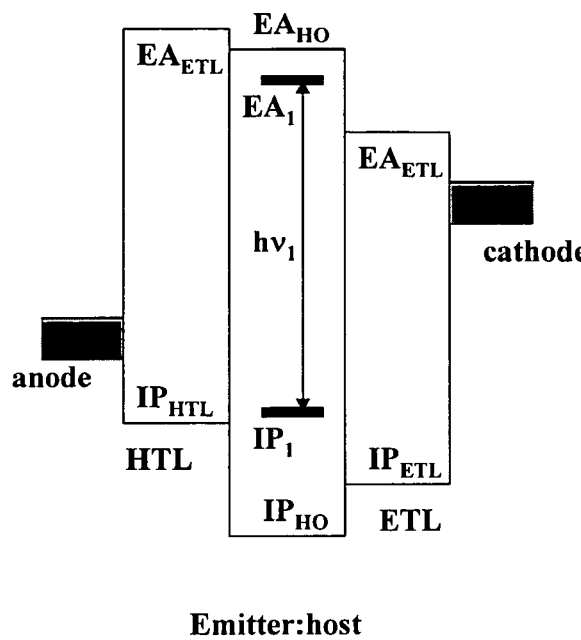
FIG. 1a illustrates the energy levels in a representative organic electronic device.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Device, and finally Examples.

1. Definitions and Clarification of Terms

Before addressing details of embodiments described below, some terms are defined or clarified.

As used herein, the term "photoactive" refers to a material that emits light when activated by an applied voltage (such as in a light-emitting diode or light-emitting electrochemical cell), or responds to radiant energy and generates a signal with or without an applied bias voltage (such as in a photodetector). An example of a photoactive layer is an emitter layer.

The term "dopant" refers to a photoactive material in a photoactive layer.

The term "layer" is used interchangeably with the term "film" and refers to a coating covering a desired area. The area can be as large as an entire device or a specific functional area such as the actual visual display, or as small as a single sub-pixel. Films can be formed by any conventional deposition technique, including vapor deposition and liquid deposition. Liquid deposition techniques include, but are not limited to, continuous deposition techniques such as spin coating, gravure coating, curtain coating, dip coating, slot-die coating, spray-coating, and continuous nozzle coating; and discontinuous deposition techniques such as ink jet printing, gravure printing, and screen printing.

The term "hydroxyaryl-N-heterocycle" is intended to mean a ligand derived from a compound having at least one nitrogen-containing heterocyclic group and at least one aromatic group with a hydroxyl substitutent, where the O of the hydroxyl group and the N of the heterocyclic ring can coordinate to a metal to form a 5- or 6-membered ring. The N-heterocyclic group and the hydroxy-substituted aromatic group can be joined with a single bond or fused together. The N-heterocyclic group and the hydroxy-substituted aromatic group can each comprise a single ring or two or more fused rings.

The energies of the various properties herein are in eV with respect to vacuum. It is known that all such energies are negative, with respect to vacuum. However, for convenience, they are listed herein as positive. The energy differences herein are all absolute values. For example, "$(EA_{P1}$ or $EA_{P2})-EA_{ET}<0.5$ eV, absolute value" means that either $|EA_{P1}-EA_{ET}|<0.5$ eV, or $|EA_{P2}-EA_{ET}|<0.5$ eV.

Color coordinates as used herein are the "x" and "y" values according to the 1931 CIE convention.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81st Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is citedIn case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Device

Typical organic electroluminescent devices consist of an anode, a hole transport layer, a photoactive layer, an electron transport layer, and a cathode. The photoactive layer usually consists of an dopant and, optionally, a host where the dopant is light emitting, as shown in FIG. 1. Holes and electrons are injected into the photoactive layer either directly to the dopant molecule or indirectly to the host molecule. In the photoactive layer, the energy gap of the host ($IP_{HO}$-$EA_{HO}$), if present, is always larger than the energy gap of the dopant so if recombination occurs on the host molecules, energy can be transferred to the dopant molecule generating electroluminescence.

Figure 1B:
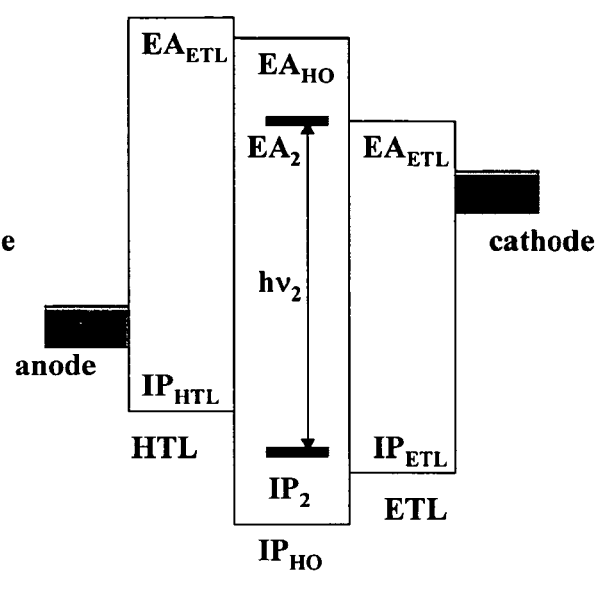
FIG. 1b illustrates the energy levels in a representative organic electronic device.

In such a dopant-host system, compromise has to be made when designing efficient electroluminescent devices. If one wants to make the electroluminescent color ($h_{v1}$ and $h_{v2}$ in FIG. 1) constant as required for full color display applications, then the ionization potential and electron affinity of the dopant molecule cannot be independently adjusted to optimize device performance. For example, if one tries to align the ionization potential of the dopant ($IP_1$ in FIG. 1a) to the ionization potential of the hole transport layer ($IP_{HTL}$), hole injection from HTL to the dopant will be enhanced, but electron injection from the electron transport layer is often compromised (FIG. 1a). Conversely, if one tries to align the electron affinity of the dopant ($EA_2$ in FIG. 1b) to the electron affinity of the electron transport layer ($EA_{ETL}$), electron injection from ETL to the dopant will be enhanced, but hole injection from the hole transport layer often suffers.

This same limitation also applies to charge transport and trapping in the photoactive layer which can affect both device efficiency and lifetime. For example, if one wishes to align the ionization potential of the dopant ($IP_{1,2}$) to the ionization potential of the host ($IP_{HO}$) to minimize hole trapping, the electron affinity of the dopant ($EA_{1,2}$) has to be decreased in order to keep the emitting wavelength constant. This causes more electron trapping. Conversely, if one wishes to align the electron affinity of the dopant ($EA_{1,2}$) to the electron affinity of the host ($EA_{HO}$), electron trapping will be minimized but hole trapping will be enhanced.

Figure 2:
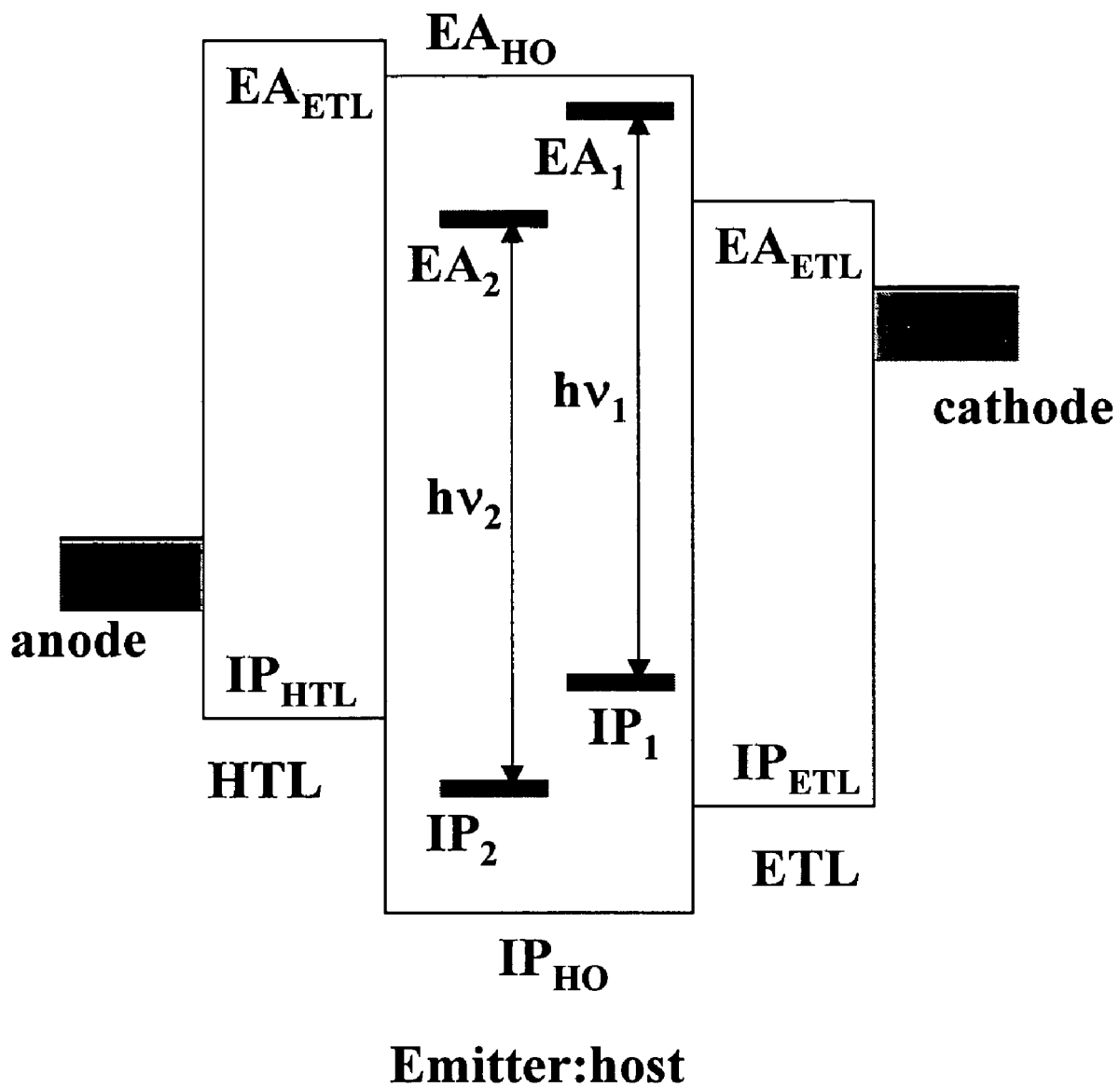
FIG. 2 illustrates the energy levels in a representative organic electronic device.

The device described herein uses a dual dopant approach where the emitting wavelengths ($h\epsilon_1$ and $h\epsilon_2$ in FIG. 2) of the two dopants are substantially the same, but with substantially different ionization potential and electron affinity as shown in FIG. 2. One can tune the ionization potential of one dopant to enhance hole injection and/or minimize hole trapping, while independently tuning the electron affinity of the other dopant to enhance electron injection and/or minimize electron trapping. Electron-hole recombination may occur on different dopant molecules but the wavelength emitted will be substantially the same and within display specification. In one embodiment, this approach may yield devices with higher efficiency.

In the device described herein, the peak wavelengths of the two dopants differ by less than 20 nm in the 570-650 nm region; less than 15 nm in the 500-570 nm region; and less than 10 nm in the 440-500 nm region.

The emitting color of both dopants is in the (0.6-0.7, 0.28-0.38) range for red; (0.2-0.35, 0.58-0.75) range for green; and (0.1-0.2, 0.05-0.25) range for blue.

In one embodiment, the ionization potentials of the two dopants differ by at least 0.1 eV. In one embodiment, they differ by at least 0.2 eV. In one embodiment, they differ by at least 0.3 eV In one embodiment, the electron affinities of the two dopants differ by at least 0.1 eV. In one embodiment, they differ by at least 0.2 eV. In one embodiment, they differ by at least 0.3 eV.

In one embodiment, the ionization potentials of the two dopants differ by at least 0.1 eV and the electron affinities of the two dopants differ by at least 0.1 eV.

In one embodiment, the difference between the ionization potential of one of the dopants and the ionization potential of the hole transport layer is less than 0.5 eV. In one embodiment, they differ by less than 0.3 eV. In one embodiment, they differ by less than 0.1 eV.

In one embodiment, the difference between the electron affinity of one of the dopants and the electron affinity of the electron transport layer is less than 0.5 eV. In one embodiment, they differ by less than 0.3 eV. In one embodiment, they differ by less than 0.1 eV.

In one embodiment, the difference between the ionization potential of one of the dopants and the ionization potential of the host is less than 0.5 eV. In one embodiment, they differ by less than 0.3 eV. In one embodiment, they differ by less than 0.1 eV.

In one embodiment, the difference between the electron affinity of one of the dopants and the electron affinity of the host is less than 0.5 eV. In one embodiment, they differ by less than 0.3 eV. In one embodiment, they differ by less than 0.1 eV.

In one embodiment, the device has the following structure, in order: anode, buffer layer, hole transport layer, photoactive layer, electron transport layer, electron injection layer, cathode.

The anode can be made of, for example, materials containing or comprising metal, mixed metals, alloy, metal oxides or mixed-metal oxide. The anode may comprise a conducting polymer, polymer blend or polymer mixtures. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide, are generally used. The anode may also comprise an organic material, especially a conducting polymer such as polyaniline, including exemplary materials as described in "Flexible light-emitting diodes made from soluble conducting polymer," Nature vol. 357, pp 477 479 (11 Jun. 1992). At least one of the anode and cathode should be at least partially transparent to allow the generated light to be observed.

The buffer layer can comprise hole transport materials. Examples of hole transport materials have been summarized, for example, in Kirk Othmer Encyclopedia of Chemical Technology, Fourth Edition, Vol. 18, p. 837 860, 1996, by Y. Wang. Both hole transporting "small" molecules as well as oligomers and polymers may be used. Hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N, N'-diphenyl-N, N'-bis(3-methylphenyl)-[1,1'-biphenyl]-4,4'-diamine (TPD); 1,1-bis[(di-4-tolylamino) phenyl]cyclohexane (TAPC); N, N'-bis(4-methylphenyl)-N, N'-bis(4-ethylphenyl)-[1,1'-(3,3'-dimethyl)biphenyl]-4,4'-diamine (ETPD); tetrakis-(3-methylphenyl)-N,N, N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl]pyrazoline (PPR or DEASP); 1,2-trans-bis (9H-carbazol-9-yl)cyclobutane (DCZB); N,N,N', N'-tetrakis (4-methylphenyl)-(1,1'-biphenyl)-4,4'-diamine (TTB); N,N'-bis(naphthalen-1-yl)-N,N'-bis-(phenyl)benzidine (α-NPB); 4,4'-N,N'-dicarbazolyl-biphenyl (CBP); and porphyrinic compounds, such as copper phthalocyanine. Useful hole transporting polymers include, but are not limited to, polyvinylcarbazole, (phenylmethyl)polysilane, poythiophene, polypyrrole, and polyaniline. The hole transporting polymer can be a complex of a conducting polymer and a colloid-forming polymeric acid, as disclosed in, published U.S. applications US 2004/0254297 and US 2004/029133. Conducting polymers are useful as a class. It is also possible to obtain hole transporting polymers by doping hole transporting moieties, such as those mentioned above, into polymers such as polystyrenes and polycarbonates.

Any of the hole transport materials discussed above for the buffer layer may be used in the hole transport layer.

Any organic electroluminescent ("EL") material can be used as a photoactive material, so long as there are two photoactive materials having the properties described above. Such materials include, but are not limited to, fluorescent dyes, small molecule organic fluorescent compounds, fluorescent and phosphorescent metal complexes, conjugated polymers, and mixtures thereof. Examples of fluorescent dyes include, but are not limited to, pyrene, perylene, rubrene, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of Iridium with phenylpyridine, phenylquinoline, or phenylpyrimidine ligands as disclosed in Petrov et al., Published PCT Application WO 02/02714, and organometallic complexes described in, for example, published applications US 2001/0019782, EP 1191612, WO 02/15645, and EP 1191614; and mixtures thereof. Electroluminescentemissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

In one embodiment of the device, photoactive material can be an organometallic complex. In another embodiment, the photoactive material is a cyclometalated complex of iridium or platinum. Other useful photoactive materials may be employed as well. Complexes of iridium with phenylpyridine, phenylquinoline, or phenylpyrimidine ligands have been disclosed as electroluminescent compounds in Petrov et al., Published PCT Application WO 02/02714. Other organometallic complexes have been described in, for example, published applications US 2001/0019782, EP 1191612, WO 02/15645, and EP 1191614. Electroluminescent devices with an active layer of polyvinyl carbazole (PVK) doped with metallic complexes of iridium have been described by Burrows and Thompson in published PCT applications WO 00/70655 and WO 01/41512. Electroluminescent emissive layers comprising a charge carrying host material and a phosphorescent platinum complex have been described by Thompson et al., in U.S. Pat. No. 6,303,238, Bradley et al., in Synth. Met. (2001), 116 (1-3), 379-383, and Campbell et al., in Phys. Rev. B, Vol. 65 085210.

Cathode layers may be deposited as lines or as a film. The cathode can be any metal or nonmetal having a lower work function than the anode. Exemplary materials for the cathode can include alkali metals of Group 1, especially lithium, the Group 2 (alkaline earth) metals, the Group 12 metals, including the rare earth elements and lanthanides, and the actinides. Materials such as aluminum, indium, calcium, barium, samarium and magnesium, as well as combinations, can be used. Li-containing and other compounds, such as LiF and $Li_2O$, may also be deposited between an organic layer and the cathode layer to lower the operating voltage of the system.

An encapsulation layer may be deposited over the cathode to prevent entry of undesirable components, such as water and oxygen, into the device. In one embodiment, the encapsulation layer is a barrier layer or film.

In one embodiment, the anode is made of indium tin oxide or indium zinc oxide. In one embodiment, the buffer layer comprises a conducting polymer selected from the group consisting of polythiophenes, polyanilines, polypyrroles, copolymers thereof, and mixtures thereof. In one embodiment, the buffer layer comprises a complex of a conducting polymer and a colloid-forming polymeric acid. In one embodiment, the buffer layer comprises a compound having triarylamine or triarylmethane groups. In one embodiment, the buffer layer comprises a material selected from the group consisting of TPD, MPMP, NPB, CBP, TDATA, and mixtures thereof, as defined above.

In one embodiment, the hole transport layer comprises a compound having Formula I or a polymer having at least one monomeric unit derived from a compound having Formula I, as described herein.

In one embodiment, the photoactive layer comprises a first and second electroluminescent metal complex and a host material. The host can be a charge transport material. In one embodiment, the host material is an organometallic complex having two or more 8-hydroxyquinolate ligands. In one embodiment, the host material is a metal complex of a hydroxyaryl-N-heterocycle. In one embodiment, the hydroxyaryl-N-heterocycle is unsubstituted or substituted 8-hydroxyquinoline. In one embodiment, the metal is aluminum. In one embodiment, the host is a material selected from the group consisting of tris(8-hydroxyquinolinato)aluminum, bis(8-hydroxyquinolinato)(4-phenylphenolato)aluminum, tetrakis(8-hydroxyquinolinato)zirconium, and mixtures thereof. In one embodiment, the host is a metal complex of at least one hydroxyaryl-N-heterocycle and at least one phenolate. In one embodiment, each of the electroluminescent metal complexes is a cyclometalated complex of iridium, platinum, rhenium, or osmium. In one embodiment, the electroluminescent complex is present in an amount of at least 1% by weight. In one embodiment, the electroluminescent complex is 2-20% by weight. In one embodiment, the electroluminescent complex is 20-50% by weight. In one embodiment, the electroluminescent complex is 50-80% by weight. In one embodiment, the electroluminescent complex is 80-99% by weight.

In one embodiment, the electron transport layer comprises a metal complex of a hydroxyaryl-N-heterocycle. In one embodiment, the hydroxyaryl-N-heterocycle is unsubstituted or substituted 8-hydroxyquinoline. In one embodiment, the metal is aluminum. In one embodiment, the electron transport layer comprises a material selected from the group consisting of tris(8-hydroxyquinolinato)aluminum, bis(8-hydroxyquinolinato) (4-phenylphenolato)aluminum, tetrakis(8-hydroxyquinolinato)zirconium, and mixtures thereof. In one embodiment, the electron injection layer is BaO, LiF or $LiO_2$. In one embodiment, the cathode is Al or Ba/Al.

In one embodiment, the device is fabricated by liquid deposition of the buffer layer, the hole transport layer, and the photoactive layer, and by vapor deposition of the electron transport layer, the electron injection layer, and the cathode.

The buffer layer can be deposited from any liquid medium in which it is dissolved or dispersed and from which it will form a film. In one embodiment, the liquid medium consists essentially of one or more organic solvents. In one embodiment, the liquid medium consists essentially of water or water and an organic solvent. In one embodiment the organic solvent is selected from the group consisting of alcohols, ketones, cyclic ethers, and polyols. In one embodiment, the organic liquid is selected from dimethylacetamide ("DMAc"), N-methylpyrrolidone ("NMP"), dimethylformamide ("DMF"), ethylene glycol ("EG"), aliphatic alcohols, and mixtures thereof. The buffer material can be present in the liquid medium in an amount from 0.5 to 10 percent by weight. Other weight percentages of buffer material may be used depending upon the liquid medium. The buffer layer can be applied by any continuous or discontinuous liquid deposition technique. In one embodiment, the buffer layer is applied by spin coating. In one embodiment, the buffer layer is applied by ink jet printing. After liquid deposition, the liquid medium can be removed in air, in an inert atmosphere, or by vacuum, at room temperature or with heating. In one embodiment, the layer is heated to a temperature less than 275° C. In one embodiment, the heating temperature is between 100° C. and 275° C. In one embodiment, the heating temperature is between 100° C. and 120° C. In one embodiment, the heating temperature is between 120° C. and 140° C. In one embodiment, the heating temperature is between 140° C. and 160° C. In one embodiment, the heating temperature is between 160° C. and 180° C. In one embodiment, the heating temperature is between 180° C. and 200° C. In one embodiment, the heating temperature is between 200° C. and 220° C. In one embodiment, the heating temperature is between 190° C. and 220° C. In one embodiment, the heating temperature is between 220° C. and 240° C. In one embodiment, the heating temperature is between 240° C. and 260° C. In one embodiment, the heating temperature is between 260° C. and 275° C. The heating time is dependent upon the temperature, and is generally between 5 and 60 minutes. In one embodiment, the final layer thickness is between 5 nm and 200 nm. In one embodiment, the final layer thickness is between 5 nm and 40 nm. In one embodiment, the final layer thickness is between 40 nm and 80 nm. In one embodiment, the final layer thickness is between 80 nm and 120 nm. In one embodiment, the final layer thickness is between 120 nm and 160 nm. In one embodiment, the final layer thickness is between 160 nm and 200 nm.

The hole transport layer can be deposited from any liquid medium in which it is dissolved or dispersed and from which it will form a film. In one embodiment, the liquid medium consists essentially of one or more organic solvents. In one embodiment, the liquid medium consists essentially of water or water and an organic solvent. In one embodiment the organic solvent is an aromatic solvent. In one embodiment, the organic liquid is selected from chloroform, dichloromethane, toluene, xylene, anisole, and mixtures thereof. The hole transport material can be present in the liquid medium in a concentration of 0.2 to 2 percent by weight. Other weight percentages of hole transport material may be used depending upon the liquid medium. The hole transport layer can be applied by any continuous or discontinuous liquid deposition technique. In one embodiment, the hole transport layer is applied by spin coating. In one embodiment, the hole transport layer is applied by ink jet printing. After liquid deposition, the liquid medium can be removed in air, in an inert atmosphere, or by vacuum, at room temperature or with heating. In one embodiment, the layer is heated to a temperature less than 275° C. In one embodiment, the heating temperature is between 170° C. and 275° C. In one embodiment, the heating temperature is between 170° C. and 200° C. In one embodiment, the heating temperature is between 190° C. and 220° C. In one embodiment, the heating temperature is between 210° C. and 240° C. In one embodiment, the heating temperature is between 230° C. and 270° C. The heating time is dependent upon the temperature, and is generally between 5 and 60 minutes. In one embodiment, the final layer thickness is between 5 nm and 50 nm. In one embodiment, the final layer thickness is between 5 nm and 15 nm. In one embodiment, the final layer thickness is between 15 nm and 25 nm. In one embodiment, the final layer thickness is between 25 nm and 35 nm. In one embodiment, the final layer thickness is between 35 nm and 50 nm.

The photoactive layer can be deposited from any liquid medium in which it is dissolved or dispersed and from which it will form a film. In one embodiment, the liquid medium consists essentially of one or more organic solvents. In one embodiment, the liquid medium consists essentially of water or water and an organic solvent. In one embodiment the organic solvent is an aromatic solvent. In one embodiment, the organic liquid is selected from chloroform, dichloromethane, toluene, anisole, and mixtures thereof. The photoactive material can be present in the liquid medium in a concentration of 0.2 to 2 percent by weight. Other weight percentages of photoactive material may be used depending upon the liquid medium. The photoactive layer can be applied by any continuous or discontinuous liquid deposition technique. In one embodiment, the photoactive layer is applied by spin coating. In one embodiment, the photoactive layer is applied by ink jet printing. After liquid deposition, the liquid medium can be removed in air, in an inert atmosphere, or by vacuum, at room temperature or with heating. In one embodiment, the deposited layer is heated to a temperature that is less than the Tg of the material having the lowest Tg. In one embodiment, the heating temperature is at least 10° C. less than the lowest Tg. In one embodiment, the heating temperature is at least 20° C. less than the lowest Tg. In one embodiment, the heating temperature is at least 30° C. less than the lowest Tg. In one embodiment, the heating temperature is between 50° C. and 150° C. In one embodiment, the heating temperature is between 50° C. and 75° C. In one embodiment, the heating temperature is between 75° C. and 100° C. In one embodiment, the heating temperature is between 100° C. and 125° C. In one embodiment, the heating temperature is between 125° C. and 150° C. The heating time is dependent upon the temperature, and is generally between 5 and 60 minutes. In one embodiment, the final layer thickness is between 25 nm and 100 nm. In one embodiment, the final layer thickness is between 25 nm and 40 nm. In one embodiment, the final layer thickness is between 40 nm and 65 nm. In one embodiment, the final layer thickness is between 65 nm and 80 nm. In one embodiment, the final layer thickness is between 80 nm and 100 nm.

The electron transport layer can be deposited by any vapor deposition method. In one embodiment, it is deposited by thermal evaporation under vacuum. In one embodiment, the final layer thickness is between 1 nm and 100 nm. In one embodiment, the final layer thickness is between 1 nm and 15 nm. In one embodiment, the final layer thickness is between 15 nm and 30 nm. In one embodiment, the final layer thickness is between 30 nm and 45 nm. In one embodiment, the final layer thickness is between 45 nm and 60 nm. In one embodiment, the final layer thickness is between 60 nm and 75 nm. In one embodiment, the final layer thickness is between 75 nm and 90 nm. In one embodiment, the final layer thickness is between 90 nm and 100 nm.

The electron injection layer can be deposited by any vapor deposition method. In one embodiment, it is deposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the material is heated to a temperature in the range of 100° C. to 400° C. In one embodiment, the material is heated to a temperature in the range of 100° C. to 150° C. In one embodiment, the material is heated to a temperature in the range of 150° C. to 200° C. In one embodiment, the material is heated to a temperature in the range of 200° C. to 250° C. In one embodiment, the material is heated to a temperature in the range of 250° C. to 300° C. In one embodiment, the material is heated to a temperature in the range of 300° C. to 350° C. In one embodiment, the material is heated to a temperature in the range of 350° C. to 400° C. In one embodiment, the material is deposited at a rate of 0.5 to 10 Å/sec. In one embodiment, the material is deposited at a rate of 0.5 to 1 Å/sec. In one embodiment, the material is deposited at a rate of 1 to 2 Å/sec. In one embodiment, the material is deposited at a rate of 2 to 3 Å/sec. In one embodiment, the material is deposited at a rate of 3 to 4 Å/sec. In one embodiment, the material is deposited at a rate of 4 to 5 Å/sec. In one embodiment, the material is deposited at a rate of 5 to 6 Å/sec. In one embodiment, the material is deposited at a rate of 6 to 7 Å/sec. In one embodiment, the material is deposited at a rate of 7 to 8 Å/sec. In one embodiment, the material is deposited at a rate of 8 to 9 Å/sec. In one embodiment, the material is deposited at a rate of 9 to 10 Å/sec. In one embodiment, the final layer thickness is between 0.1 nm and 3 nm. In one embodiment, the final layer thickness is between 0.1 nm and 1 nm. In one embodiment, the final layer thickness is between 1 nm and 2 nm. In one embodiment, the final layer thickness is between 2 nm and 3 nm.

The cathode can be deposited by any vapor deposition method. In one embodiment, it is deposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the material is heated to a temperature in the range of 100° C. to 400° C. In one embodiment, the material is heated to a temperature in the range of 100° C. to 150° C. In one embodiment, the material is heated to a temperature in the range of 150° C. to 200° C. In one embodiment, the material is heated to a temperature in the range of 200° C. to 250° C. In one embodiment, the material is heated to a temperature in the range of 250° C. to 300° C. In one embodiment, the material is heated to a temperature in the range of 300° C. to 350° C. In one embodiment, the material is heated to a temperature in the range of 350° C. to 400° C. In one embodiment, the material is deposited at a rate of 0.5 to 10 Å/sec. In one embodiment, the material is deposited at a rate of 0.5 to 1 Å/sec. In one embodiment, the material is deposited at a rate of 1 to 2 Å/sec. In one embodiment, the material is deposited at a rate of 2 to 3 Å/sec. In one embodiment, the material is deposited at a rate of 3 to 4 Å/sec. In one embodiment, the material is deposited at a rate of 4 to 5 Å/sec. In one embodiment, the material is deposited at a rate of 5 to 6 Å/sec. In one embodiment, the material is deposited at a rate of 6 to 7 Å/sec. In one embodiment, the material is deposited at a rate of 7 to 8 Å/sec. In one embodiment, the material is deposited at a rate of 8 to 9 Å/sec. In one embodiment, the material is deposited at a rate of 9 to 10 Å/sec. In one embodiment, the final layer thickness is between 10 nm and 10000 nm. In one embodiment, the final layer thickness is between 10 nm and 1000 nm. In one embodiment, the final layer thickness is between 10 nm and 50 nm. In one embodiment, the final layer thickness is between 50 nm and 100 nm. In one embodiment, the final layer thickness is between 100 nm and 200 nm. In one embodiment, the final layer thickness is between 200 nm and 300 nm. In one embodiment, the final layer thickness is between 300 nm and 400 nm. In one embodiment, the final layer thickness is between 400 nm and 500 nm. In one embodiment, the final layer thickness is between 500 nm and 600 nm. In one embodiment, the final layer thickness is between 600 nm and 700 nm. In one embodiment, the final layer thickness is between 700 nm and 800 nm. In one embodiment, the final layer thickness is between 800 nm and 900 nm. In one embodiment, the final layer thickness is between 900 nm and 1000 nm. In one embodiment, the final layer thickness is between 1000 nm and 2000 nm. In one embodiment, the final layer thickness is between 2000 nm and 3000 nm. In one embodiment, the final layer thickness is between 3000 nm and 4000 nm. In one embodiment, the final layer thickness is between 4000 nm and 5000 nm. In one embodiment, the final layer thickness is between 5000 nm and 6000 nm. In one embodiment, the final layer thickness is between 6000 nm and 7000 nm. In one embodiment, the final layer thickness is between 7000 nm and 8000 nm. In one embodiment, the final layer thickness is between 8000 nm and 9000 nm. In one embodiment, the final layer thickness is between 9000 nm and 10000 nm.

In one embodiment, the device is fabricated by vapor deposition of the buffer layer, the hole transport layer, and the photoactive layer, the electron transport layer, the electron injection layer, and the cathode.

In one embodiment, the buffer layer is applied by vapor deposition. In one embodiment, it is deposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the material is heated to a temperature in the range of 100° C. to 400° C. In one embodiment, the material is heated to a temperature in the range of 100° C. to 150° C. In one embodiment, the material is heated to a temperature in the range of 150° C. to 200° C. In one embodiment, the material is heated to a temperature in the range of 200° C. to 250° C. In one embodiment, the material is heated to a temperature in the range of 250° C. to 300° C. In one embodiment, the material is heated to a temperature in the range of 300° C. to 350° C. In one embodiment, the material is heated to a temperature in the range of 350° C. to 400° C. In one embodiment, the material is deposited at a rate of 0.5 to 10 Å/sec. In one embodiment, the material is deposited at a rate of 0.5 to 1 Å/sec. In one embodiment, the material is deposited at a rate of 1 to 2 Å/sec. In one embodiment, the material is deposited at a rate of 2 to 3 Å/sec. In one embodiment, the material is deposited at a rate of 3 to 4 Å/sec. In one embodiment, the material is deposited at a rate of 4 to 5 Å/sec. In one embodiment, the material is deposited at a rate of 5 to 6 Å/sec. In one embodiment, the material is deposited at a rate of 6 to 7 Å/sec. In one embodiment, the material is deposited at a rate of 7 to 8 Å/sec. In one embodiment, the material is deposited at a rate of 8 to 9 Å/sec. In one embodiment, the material is deposited at a rate of 9 to 10 Å/sec. In one embodiment, the final layer thickness is between 5 nm and 200 nm. In one embodiment, the final layer thickness is between 5 nm and 30 nm. In one embodiment, the final layer thickness is between 30 nm and 60 nm. In one embodiment, the final layer thickness is between 60 nm and 90 nm. In one embodiment, the final layer thickness is between 90 nm and 120 nm. In one embodiment, the final layer thickness is between 120 nm and 150 nm. In one embodiment, the final layer thickness is between 150 nm and 280 nm. In one embodiment, the final layer thickness is between 180 nm and 200 nm.

In one embodiment, the hole transport layer is applied by vapor deposition. In one embodiment, it is deposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the material is heated to a temperature in the range of 100° C. to 400° C. In one embodiment, the material is heated to a temperature in the range of 100° C. to 150° C. In one embodiment, the material is heated to a temperature in the range of 150° C. to 200° C. In one embodiment, the material is heated to a temperature in the range of 200° C. to 250° C. In one embodiment, the material is heated to a temperature in the range of 250° C. to 300° C. In one embodiment, the material is heated to a temperature in the range of 300° C. to 350° C. In one embodiment, the material is heated to a temperature in the range of 350° C. to 400° C. In one embodiment, the material is deposited at a rate of 0.5 to 10 Å/sec. In one embodiment, the material is deposited at a rate of 0.5 to 1 Å/sec. In one embodiment, the material is deposited at a rate of 1 to 2 Å/sec. In one embodiment, the material is deposited at a rate of 2 to 3 Å/sec. In one embodiment, the material is deposited at a rate of 3 to 4 Å/sec. In one embodiment, the material is deposited at a rate of 4 to 5 Å/sec. In one embodiment, the material is deposited at a rate of 5 to 6 Å/sec. In one embodiment, the material is deposited at a rate of 6 to 7 Å/sec. In one embodiment, the material is deposited at a rate of 7 to 8 Å/sec. In one embodiment, the material is deposited at a rate of 8 to 9 Å/sec. In one embodiment, the material is deposited at a rate of 9 to 10 Å/sec. In one embodiment, the final layer thickness is between 5 nm and 200 nm. In one embodiment, the final layer thickness is between 5 nm and 30 nm. In one embodiment, the final layer thickness is between 30 nm and 60 nm. In one embodiment, the final layer thickness is between 60 nm and 90 nm. In one embodiment, the final layer thickness is between 90 nm and 120 nm. In one embodiment, the final layer thickness is between 120 nm and 150 nm. In one embodiment, the final layer thickness is between 150 nm and 280 nm. In one embodiment, the final layer thickness is between 180 nm and 200 nm.

In one embodiment, the photoactive layer is applied by vapor deposition. In one embodiment, it is deposited by thermal evaporation under vacuum. In one embodiment, the photoactive layer consists essentially of a single electroluminescent compound, which is desposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the material is heated to a temperature in the range of 100° C. to 400° C. In one embodiment, the material is heated to a temperature in the range of 100° C. to 150° C. In one embodiment, the material is heated to a temperature in the range of 150° C. to 200° C. In one embodiment, the material is heated to a temperature in the range of 200° C. to 250° C. In one embodiment, the material is heated to a temperature in the range of 250° C. to 300° C. In one embodiment, the material is heated to a temperature in the range of 300° C. to 350° C. In one embodiment, the material is heated to a temperature in the range of 350° C. to 400° C. In one embodiment, the material is deposited at a rate of 0.5 to 10 Å/sec. In one embodiment, the material is deposited at a rate of 0.5 to 1 Å/sec. In one embodiment, the material is deposited at a rate of 1 to 2 Å/sec. In one embodiment, the material is deposited at a rate of 2 to 3 Å/sec. In one embodiment, the material is deposited at a rate of 3 to 4 Å/sec. In one embodiment, the material is deposited at a rate of 4 to 5 Å/sec. In one embodiment, the material is deposited at a rate of 5 to 6 Å/sec. In one embodiment, the material is deposited at a rate of 6 to 7 Å/sec. In one embodiment, the material is deposited at a rate of 7 to 8 Å/sec. In one embodiment, the material is deposited at a rate of 8 to 9 Å/sec. In one embodiment, the material is deposited at a rate of 9 to 10 Å/sec. In one embodiment, the final layer thickness is between 5 nm and 200 nm. In one embodiment, the final layer thickness is between 5 nm and 30 nm. In one embodiment, the final layer thickness is between 30 nm and 60 nm. In one embodiment, the final layer thickness is between 60 nm and 90 nm. In one embodiment, the final layer thickness is between 90 nm and 120 nm. In one embodiment, the final layer thickness is between 120 nm and 150 nm. In one embodiment, the final layer thickness is between 150 nm and 280 nm. In one embodiment, the final layer thickness is between 180 nm and 200 nm.

In one embodiment, the photoactive layer comprises two electroluminescent materials, each of which is applied by thermal evaporation under vacuum. Any of the above listed vacuum conditions and temperatures can be used. Any of the above listed deposition rates can be used. The relative deposition rates can be from 50:1 to 1:50. In one embodiment, the relative deposition rates are from 1:1 to 1:3. In one embodiment, the relative deposition rates are from 1:3 to 1:5. In one embodiment, the relative deposition rates are from 1:5 to 1:8. In one embodiment, the relative deposition rates are from 1:8 to 1:10. In one embodiment, the relative deposition rates are from 1:10 to 1:20. In one embodiment, the relative deposition rates are from 1:20 to 1:30. In one embodiment, the relative deposition rates are from 1:30 to 1:50. The total thickness of the layer can be the same as that described above for a single-component photoactive layer.

In one embodiment, the photoactive layer comprises one electroluminescent material and at least one host material, each of which is applied by thermal evaporation under vacuum. Any of the above listed vacuum conditions and temperatures can be used. Any of the above listed deposition rates can be used. The relative deposition rate of electroluminescent material to host can be from 1:1 to 1:99. In one embodiment, the relative deposition rates are from 1:1 to 1:3. In one embodiment, the relative deposition rates are from 1:3 to 1:5. In one embodiment, the relative deposition rates are from 1:5 to 1:8. In one embodiment, the relative deposition rates are from 1:8 to 1:10. In one embodiment, the relative deposition rates are from 1:10 to 1:20. In one embodiment, the relative deposition rates are from 1:20 to 1:30. In one embodiment, the relative deposition rates are from 1:30 to 1:40. In one embodiment, the relative deposition rates are from 1:40 to 1:50. In one embodiment, the relative deposition rates are from 1:50 to 1:60. In one embodiment, the relative deposition rates are from 1:60 to 1:70. In one embodiment, the relative deposition rates are from 1:70 to 1:80. In one embodiment, the relative deposition rates are from 1:80 to 1:90. In one embodiment, the relative deposition rates are from 1:90 to 1:99. The total thickness of the layer can be the same as that described above for a single-component photoactive layer.

In one embodiment, the electron transport layer is applied by vapor deposition. In one embodiment, it is deposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the material is heated to a temperature in the range of 100° C. to 400° C. In one embodiment, the material is heated to a temperature in the range of 100° C. to 150° C. In one embodiment, the material is heated to a temperature in the range of 150° C. to 200° C. In one embodiment, the material is heated to a temperature in the range of 200° C. to 250° C. In one embodiment, the material is heated to a temperature in the range of 250° C. to 300° C. In one embodiment, the material is heated to a temperature in the range of 300° C. to 350° C. In one embodiment, the material is heated to a temperature in the range of 350° C. to 400° C. In one embodiment, the material is deposited at a rate of 0.5 to 10 Å/sec. In one embodiment, the material is deposited at a rate of 0.5 to 1 Å/sec. In one embodiment, the material is deposited at a rate of 1 to 2 Å/sec. In one embodiment, the material is deposited at a rate of 2 to 3 Å/sec. In one embodiment, the material is deposited at a rate of 3 to 4 Å/sec. In one embodiment, the material is deposited at a rate of 4 to 5 Å/sec. In one embodiment, the material is deposited at a rate of 5 to 6 Å/sec. In one embodiment, the material is deposited at a rate of 6 to 7 Å/sec. In one embodiment, the material is deposited at a rate of 7 to 8 Å/sec. In one embodiment, the material is deposited at a rate of 8 to 9 Å/sec. In one embodiment, the material is deposited at a rate of 9 to 10 Å/sec. In one embodiment, the final layer thickness is between 5 nm and 200 nm. In one embodiment, the final layer thickness is between 5 nm and 30 nrn. In one embodiment, the final layer thickness is between 30 nm and 60 nm. In one embodiment, the final layer thickness is between 60 nm and 90 nm. In one embodiment, the final layer thickness is between 90 nm and 120 nm. In one embodiment, the final layer thickness is between 120 nm and 150 nm. In one embodiment, the final layer thickness is between 150 nm and 280 nm. In one embodiment, the final layer thickness is between 180 nm and 200 nm.

In one embodiment, the electron injection layer is applied by vapor deposition, as described above.

In one embodiment, the cathode is applied by vapor deposition, as describe above.

In one embodiment, the device is fabricated by vapor deposition of some of the organic layers, and liquid deposition of some of the organic layers. In one embodiment, the device is fabricated by liquid deposition of the buffer layer, and vapor deposition of all of the other layers.

EXAMPLES

The concepts described herein will be further described in the following examples, which do not limit the scope of the invention described in the claims.

The materials used in the examples are as follows:

Buffer 1 was an aqueous dispersion of poly(3,4-dioxythiophene) and a polymeric fluorinated sulfonic acid. The material was prepared using a procedure similar to that described in Example 3 of published U.S. patent application no. 2004/0254297.

NPB: N,N'-Bis(naphthalen-1-yl)-N,N'-bis-(phenyl)benzidine

TDATA: 4,4',4"-Tris-(N,N-diphenyl-amino)-triphenylamine

Red 1:

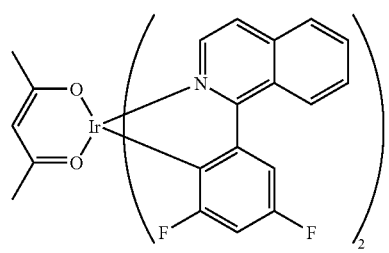

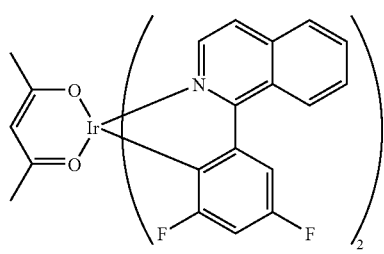

Red 2

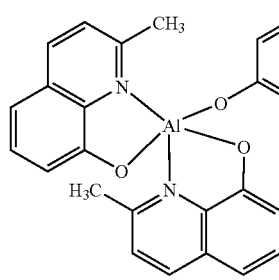

Balq2

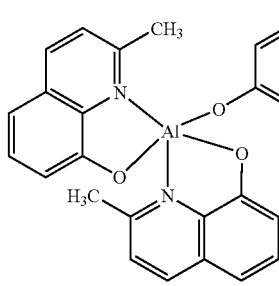

ZrQ

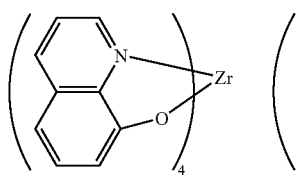

The ionization potentials (IP) and electron affinities (EA) of the materials are as follows:

| Material | IP, eV | EA |
| --- | --- | --- |
| Red 1 | 5.6 | 2.0 |
| Red 2 | 5.8 | 2.3 |
| NPB | 5.4 | 1.4 |
| TDATA | 5.0 | 0.8 |
| Balq2 | 6.1 | 1.4 |
| ZrQ | 5.7 | 2.3 |

Comparative Example A

A device was made with the standard thermal vapor deposition technique. A substrate with 100 nm indium tin oxide was used as the anode. The substrate was cleaned under uv-ozone for 10 min. and then under oxygen plasma for 1.5 min. A layer of Buffer 1 was applied by spin coating. A hole transport layer of TDATA and NPB was deposited by thermal evaporation. The photoactive layer contained 3.2 nm of Red 1 doped in 40 nm of Balq2. ZrQ was deposited as the electron transport layer. LiF/Al was the cathode.

The device characterization data is summarized in Table I. FIG. 3 shows the efficiency (cd/A) vs voltage data and FIG. 4 shows the electroluminescent spectrum.

Comparative Example B

A device was made as described in Comparative Example A, except that the photoactive layer contained 3.2 nm of Red 2 doped in 40 nm of Balq2.

The device characterization data is summarized in Table I. FIG. 3 shows the efficiency (cd/A) vs voltage data and FIG. 4 shows the electroluminescent spectrum.

Example 1

A device was made as described in Comparative Example A, except that the photoactive layer contained 3.2 nm of Red 1 and Red 2 mixtures doped in 40 nm of Balq2. Red 1 and Red 2 powders were thoroughly mixed in a mortar before deposition and then loaded into a Ta boat during deposition.

The device characterization data is summarized in Table I. FIG. 3 shows the efficiency (cd/A) vs voltage data and FIG. 4 shows the electroluminescent spectrum.

From FIG. 4, the device using Red 1+Red 2 as dual dopants gives an electroluminescent spectrum that is in between the Red 1 and Red 2 electroluminescent spectra. This is also reflected in the color coordinates (Table I), as they all fall into the acceptable range for full color display.

From FIG. 3 and Table I, it is shown that the device using Red 1+Red 2 as dual dopants gives higher efficiency than devices using either Red 1 or Red 2 alone. The difference becomes bigger at 10V than at 5 V.

TABLE I

Device data

| | Efficiency at 5 V, cd/A | Efficiency at 10 V, cd/A | Color coordinates (x, y) |
|---|---|---|---|
| Comparative example A | 19.8 | 14 | (0.649, 0.348) |
| Comparative example B | 18.1 (R464) | 14.5 | (0.642, 0.354) |
| Example 1 | 21.1 | 18.5 | (0.651, 0.351) |

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

In some embodiments, the invention herein can be construed as excluding any element or process step that does not materially affect the basic and novel characteristics of the composition or process. Additionally, in some embodiments, the invention can be construed as excluding any element or process step not specified herein.

The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. An electronic device comprising:
    a hole transport layer having an ionization potential $IP_{HT}$, and an electron affinity $EA_{HT}$,
    a photoactive layer, and
    an electron transport layer having an ionization potential $IP_{ET}$, and an electron affinity $EA_{ET}$,
    wherein the photoactive layer comprises:
        a host having an ionization potential $IP_H$ and an electron affinity $EA_H$,
        a first photoactive material having a peak wavelength λ1, an emission color with coordinates x1 and y1, an ionization potential $IP_{P1}$ and an electron affinity $EA_{P1}$, and
        a second photoactive material, having a peak wavelength λ2, an emission color with coordinates x2 and y2, an ionization potential $IP_{P2}$ and an electron affinity $EA_{P2}$;
    wherein:
        when λ1 is 570 to 650 nm:
            λ1-λ2 is less than 20 nm, absolute value,
            x1 and x2 are 0.6-0.7, and
            y1 and y2 are 0.28-0.38;
        when λ1 is 500 to 569 nm:
            λ1-λ2 is less than 15 nm, absolute value,
            x1 and x2 are 0.2-0.35, and
            y1 and y2 are 0.58-0.75;
        when λ1 is 440 to 499 nm:
            λ1-λ2 is less than 10 nm, absolute value,
            x1 and x2 are 0.1-0.2, and
            y1 and y2 are 0.05-0.25,
    and further wherein
        $IP_{P1}$-$IP_{P2}$>0.1 eV, absolute value,
        $EA_{P1}$-$EA_{P2}$>0.1 eV, absolute value.

2. A device of claim 1 wherein at least one of the following conditions is present, where eV values are expressed as absolute values:
    (a) ($IP_{P1}$ or $IP_{P2}$)-$IP_{HT}$<0.5 eV
    (b) ($EA_{P1}$ or $EA_{P2}$)-$EA_{HT}$<0.5 eV
    (c) ($IP_{P1}$ or $IP_{P2}$)-$IP_H$<0.5 eV (d) $(EA_{P1}$ or $EA_{P2})-EA_H<0.5$ eV.

3. A device of claim 2 wherein $(IP_{P1}$ or $IP_{P2})-IP_{HT}<0.3$ eV.

4. A device of claim 2 wherein $(IP_{P1}$ or $IP_{P2})-IP_{HT}<0.1$ eV.

5. A device of claim 2 wherein $(IP_{P1}$ or $IP_{P2})-IP_H<0.3$ eV.

6. A device of claim 2 wherein $(IP_{P1}$ or $IP_{P2})-IP_H<0.1$ eV.

7. A device of claim 2 wherein $(EA_{P1}$ or $EA_{P2})-EA_H<0.3$ eV.

8. A device of claim 2 wherein $(EA_{P1}$ or $EA_{P2})-EA_H<0.1$ eV.

9. A device of claim 2 having the following structure, in order:
anode, buffer layer, hole transport layer, photoactive layer, electron transport layer, electron injection layer, cathode.

10. A device of claim 2 wherein the photoactive layer comprises Red 1 and Red 2 doped in a metallic complex, wherein:

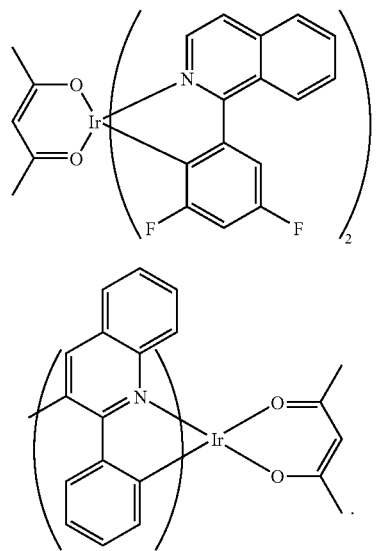

Red 1

Red 2

11. A device of claim 10 wherein the metallic complex is Balq2:

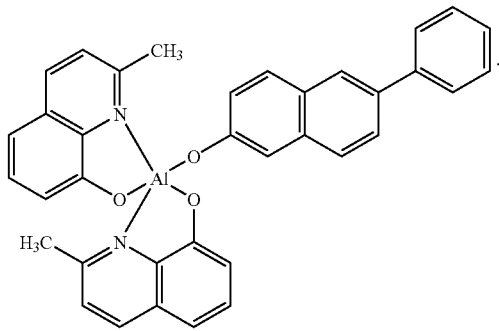

Balq2.

12. A device of claim 1 wherein the ionization potentials of the first and second photoactive materials differ by at least 0.1 eV.

13. A device of claim 1 wherein the electron affinities of the first and second photoactive materials differ by at least 0.1 eV.

14. A device of claim 1 wherein the ionization potentials of the first and second photoactive materials differ by at least 0.1 eV and the electron affinities of the first and second photoactive materials differ by at least 0.1 eV.

15. A device of claim 1 wherein $(EA_{P1}$ or $EA_{P2})-EA_{ET}<0.5$ eV.

16. A device of claim 1 having the following structure, in order:
anode, buffer layer, hole transport layer, photoactive layer, electron transport layer, electron injection layer, cathode.

17. A device of claim 1 wherein the photoactive layer comprises Red 1 and Red 2 doped in a metallic complex, wherein:

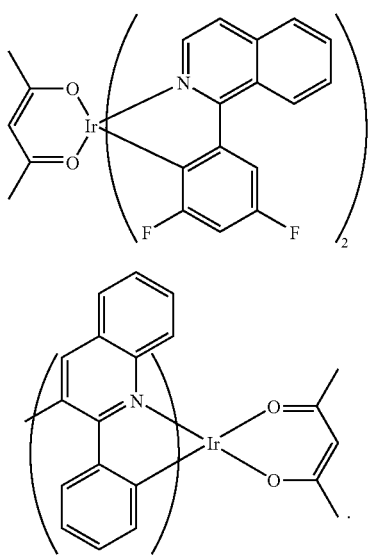

Red 1

Red 2

18. A device of claim 17 wherein the metallic complex is Balq2 wherein:

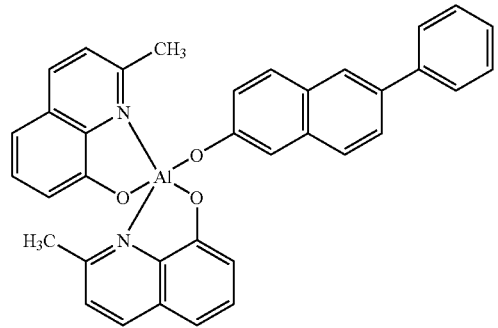

Balq2.

* * * * *